(12) United States Patent
Jin et al.

(10) Patent No.: US 9,292,384 B2
(45) Date of Patent: Mar. 22, 2016

(54) STORAGE SYSTEMS WITH ADAPTIVE ERASURE CODE GENERATION (71) Applicant: INTEL CORPORATION, Santa Clara, CA (US)

(72) Inventors: Jun Jin, Shanghai (CN); Zhonghui Jin, Shanghai (CN); Nan Stan Qiao, Beijing (CN); Zeyu Di, Beijing (CN)

(73) Assignee: Intel Corporation, Santa Clara, CA (US)

( * ) Notice: Subject to any disclaimer, the term of this patent is extended or adjusted under 35 U.S.C. 154(b) by 181 days.

(21) Appl. No.: 14/125,297

(22) PCT Filed: Aug. 5, 2013

(86) PCT No.: PCT/CN2013/080805
§ 371 (c)(1),
(2) Date: Dec. 10, 2013

(87) PCT Pub. No.: WO2015/017963
PCT Pub. Date: Feb. 12, 2015

(65) Prior Publication Data
US 2015/0220392 A1    Aug. 6, 2015

(51) Int. Cl.
*H03M 13/00* (2006.01)
*G06F 11/10* (2006.01)
*H03M 13/05* (2006.01)
*H03M 13/37* (2006.01)
*H03M 13/35* (2006.01)

(52) U.S. Cl.
CPC ........... *G06F 11/1076* (2013.01); *H03M 13/05* (2013.01); *H03M 13/353* (2013.01); *H03M 13/373* (2013.01)

(58) Field of Classification Search
CPC .............. G06F 11/004; G06F 11/1456; G06F 11/1474; G06F 11/1464; G06F 11/1453; G06F 11/1076; G06F 3/0617; G06F 3/0656; G06F 3/0659; G06F 3/067; G06F 17/30194; H03M 13/353; H03M 13/373; H04N 21/442; H04N 21/231; H04N 21/2405; H04L 67/1008
See application file for complete search history.

(56) References Cited

U.S. PATENT DOCUMENTS

| 8,869,001 | B1 * | 10/2014 | Lazier | 714/755 |
| 2011/0055661 | A1 * | 3/2011 | Grube et al. | 714/763 |
| 2012/0017140 | A1 | 1/2012 | Wylie et al. | |
| 2012/0198195 | A1 | 8/2012 | Wylie | |
| 2013/0132800 | A1 | 5/2013 | Healey, Jr. et al. | |

FOREIGN PATENT DOCUMENTS

| CN | 101868785 A | 10/2010 |
| CN | 103106124 A | 5/2013 |

OTHER PUBLICATIONS

International Search Report and Written Opinion mailed May 21, 2014 for International Application No. PCT/CN2013/080805, 16 pages.

* cited by examiner

*Primary Examiner* — Guerrier Merant
(74) *Attorney, Agent, or Firm* — Schwabe, Williamson & Wyatt, P.C.

(57) ABSTRACT

Apparatuses, methods and storage medium associated with generating erasure codes for data to be stored in a storage system. In embodiments, a method may include launching, by storage system, a plurality of instances of an erasure code generation module, based at least in part on hardware configuration of the storage system. Additionally, the method may further include setting, by the storage system, operational parameters of the plurality of instances of the erasure code generation module, based at least in part on current system load of the storage system. Further, the method may include operating, by the storage system, the plurality of instances of the erasure code generation module to generate erasure codes for data to be stored in the storage system, in accordance with the operational parameters set. Other embodiments may be described and claimed.

13 Claims, 6 Drawing Sheets

STORAGE SYSTEMS WITH ADAPTIVE ERASURE CODE GENERATION

CROSS REFERENCE TO RELATED APPLICATIONS

The present application is a national phase entry under 35 U.S.C. §371 of International Application No. PCT/CN2013/080805, filed Aug. 5, 2013, entitled "STORAGE SYSTEMS WITH ADAPTIVE ERASURE CODE GENERATION", which designated, among the various States, the United States of America. The Specification of the PCT/CN2013/080805 Application is hereby incorporated by reference.

TECHNICAL FIELD

The present disclosure relates to the field of data storage, in particular, to apparatuses, methods and storage medium associated with adaptive generation of erasure codes for scale out storage systems.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

With advances in integrated circuit, computing, networking and other related technologies, storage systems constituted with a scalable number of computer-storage nodes (also known as scale out storage systems) have become increasingly popular. For data reliability, such as recovering from data errors, erasure codes that transform k symbols into n symbols, with n greater k, to enable recovery of the k symbols from a subset of the n symbols are often employed. With the increased popularity, the ability to generate the erasure codes efficiently has become a subject of great interest.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Apparatuses, methods and storage medium associated with generating erasure codes for data to be stored in a storage system. In embodiments, a method may include launching, by storage system, a plurality of instances of an erasure code generation module, based at least in part on hardware configuration of the storage system. Additionally, the method may further include setting, by the storage system, operational parameters of the plurality of instances of the erasure code generation module, based at least in part on current system load of the storage system. Further, the method may include operating, by the storage system, the plurality of instances of the erasure code generation module to generate erasure codes for data to be stored in the storage system, in accordance with the operational parameters set.

In embodiments, a storage system configured to practice the above method and its variants may include an erasure code generation module and a dispatch engine. In embodiments, the apparatus may further include a system monitor and/or an execution monitor. In embodiments, instances of the erasure code generation module may cooperate to copy a first data block to a first, a second, and a third computer-storage node of the storage system, copy a second data block to a first, a fourth, and a fifth computer-storage node of the storage system, and copy a third data block to a first, a third, and a fourth computer-storage node of the storage system. The instances of the erasure code generation module may then cooperate to generate a first and a second parity of the first, the second, and the third data block on the first computer-storage node.

These and other aspects will be further described in more detail below, with references to the accompanying drawings which form a part hereof. Like numerals in the drawings designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. The term "closed captions" is to include traditional closed captions and/or subtitles.

Figure 1:
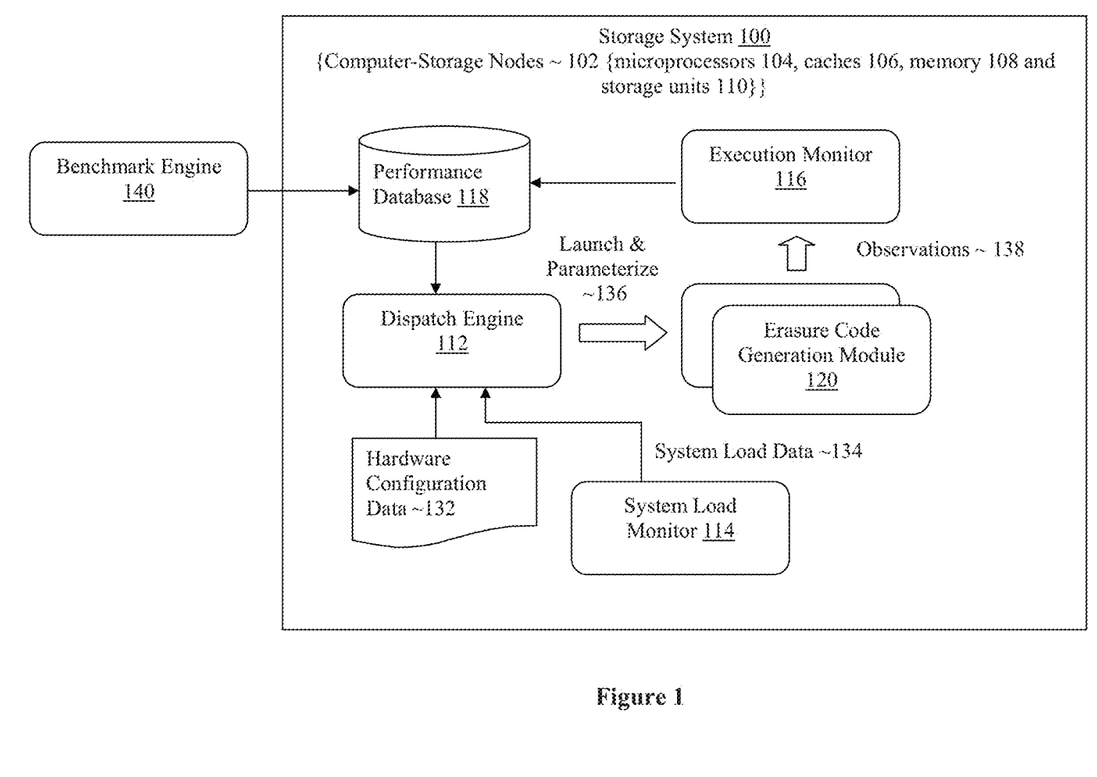
FIG. 1 illustrates a component view of a storage system incorporated with the teachings of the present disclosure, in accordance with various embodiments.

Referring now FIG. 1, a component view of a storage system incorporated with the teachings of the present disclosure is shown, in accordance with various embodiments. As illustrated, in embodiments, storage system 100 may include a number of computer-storage nodes 102 networked together. Each computer-storage node 102 may have one or more microprocessors 104, one or more caches 106, one or more memory units 108, and one or more storage units 110. In embodiments, one or more of the microprocessors 104 may include multiple processor cores. Further, storage system 100 may include an erasure code generation module 120 configured to generate erasure codes for data being stored in the storages of computer-storage nodes 102. Additionally, storage system 100 may include dispatch engine 112, optionally assisted by system load monitor 114, execution monitor 116 and/or performance database 118, to enable a variable number of instances of erasure code generation module 120 to be adaptively launched and/or parameterized to generate erasure codes for data being stored in the storage units 110. In embodiments, each instance of erasure code generation module 120 may execute in its own thread. In embodiments, the variable number of instances/threads of erasure code generation module 120 may be adaptively launched and parameterized (e.g., different buffer sizes, different erasure code sizes), based at least in part on the underlying hardware configuration, and/or current system load of storage system 100. These are other aspects of storage system 100 will be described in more detail in turn below.

In embodiments, as described earlier, dispatch engine 112 may be configured to adaptively launch 136 a number of instances/threads of erasure code generation module 120 to generate erasure codes for data being stored in storage units 110, based at least in part on optimization information predetermined and stored for various hardware configurations. In embodiments, erasure code generation module 120 may be configured to generate erasure codes for the data to be stored, transforming k data symbols to be stored into n data symbols, with n greater k, to enable recovery of the k data symbols from a subset of the n data symbols. Example embodiments of erasure code generation module 120 will be further described below with references to FIGS. 3-4.

In embodiments, hardware configuration information may include, but are not limited to, processor types/speeds, memory capacity, input/output (I/O) channel capability, data block sizes, and so forth. In embodiments, dispatch engine 112 may be configured to query the various components of storage system 100 to collect hardware configuration data 132 of storage system 100. In other embodiments, hardware configuration data 132 of storage system 100 may be pre-collected and stored in reserved storage areas, such as read-only memory (ROM), of storage system 100.

In embodiments, the optimization information for various hardware configurations may be predetermined by benchmark engine 140, and stored in performance database 118. Benchmark engine 140 may be configured to pre-perform the benchmarking for various hardware configurations.

In embodiments, system load monitor 114 may be configured to monitor the current system load of storage system 100, and provide dispatch engine 112 with current system load data 134, to enable dispatch engine 112 to adaptively parameterize 136 the instances/threads of erasure code generation module 120. Example of system load data 134 may include, but are not limited to, processor usage, memory usage, input/output (I/O) channel usage, cache misses, volume of interrupts, and so forth. Example parameters of erasure code generation module 120 may include, but not limited to, different buffer sizes, different erasure code sizes, such as different (k, n-k) combination.

In embodiments, execution monitor 116 may be configured to monitor the execution of the instances/threads of erasure code generation module 120, and provide dispatch engine 112 with feedback, with respect to the current and various optimized launching and parameterization employed by dispatch engine 112. In embodiments, execution monitor 116 may record its observations 138 in performance database 118, and provide feedback to dispatch engine 112 via performance database 118. Examples of observations may include, but not limited to, erasure code generation rate, number of busy, suspended or idle threads in a time period, and so forth.

In embodiments, microprocessors 104, caches 106, memory 108, and storage units 110 may be any one of a wide range of these elements known in the art. Dispatch engine 112, system load monitor 114, execution monitor 116, erasure code generation module 120, and benchmark engine 140 may be implemented in any high level programming instructions with compilers configured to compile the high level programming instructions into instructions of the instruction set architectures of microprocessors 104. In embodiments, one or more dispatch engine 112, system load monitor 114, execution monitor 116 and/or benchmark engine 140 may be implemented in hardware, in part or in full.

Figure 2:
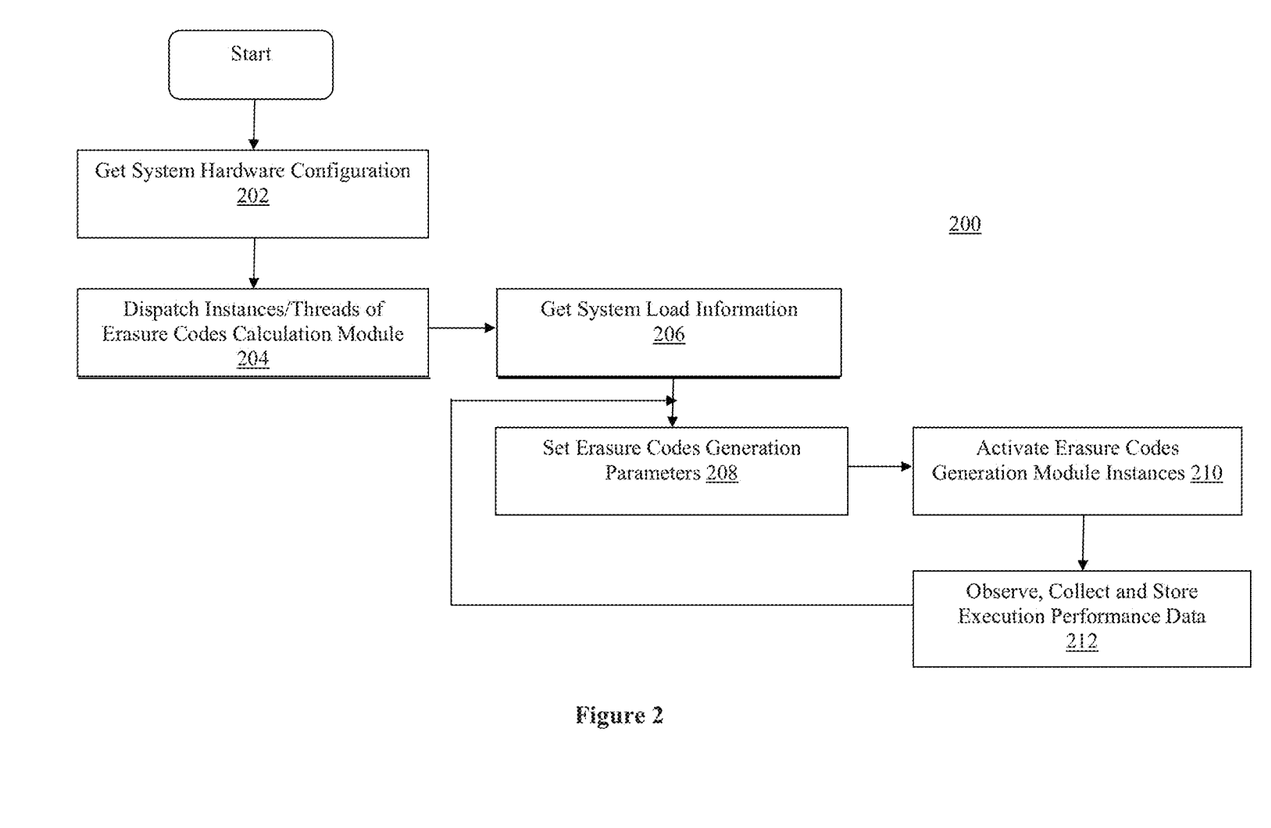
FIG. 2 illustrates a method for storing data incorporated with the teachings of the present disclosure, in accordance with various embodiments.

Referring now to FIG. 2, wherein a method for storing data incorporated with the teachings of the present disclosure is shown, in accordance with various embodiments. As illustrated, method 200 for storing data may start at block 202. At block 202, at power on or reset, system hardware configuration information of a storage system may be obtained, e.g., by earlier described dispatch engine 112. From block 202, method 200 may proceed to block 204. At block 204, a variable number of instances/threads of erasure code generation module 120 may be launched, e.g., by earlier described dispatch engine 112, based at least in part on the system hardware configured obtained, to generate erasure codes for data to be stored in the storage system.

From block 204, method 200 may proceed to block 206. At block 206, system load information of the storage system may be obtained, e.g., by earlier described dispatch engine 112. From block 206, method 200 may proceed to block 208. At block 208, operational parameters of the various instances/threads of erasure code generation module 120 may be set, e.g., by earlier described dispatch engine 112, based at least in part on the current system load information obtained.

From block 208, method 200 may proceed to block 210. At block 210, system load information of the storage system may be obtained, e.g., by earlier described system load monitor 114. From block 208, method 200 may proceed to block 210. At block 210, the various instances/threads of erasure code generation module 120 may be activated/given execution control, e.g., by earlier described dispatch engine 112.

From block 210, method 200 may proceed to block 212. At block 212, execution of the various instances/threads of erasure code generation module 120 may be observed, e.g., by execution monitor 116.

From block 212, method 200 may return to block 208, where the operational parameter of the various instances/threads of erasure code generation module may be modified based at least in part on the execution performance observed. From block 208, method 200 may proceed to block 210, and beyond, as earlier described.

Method 200 may continue, until eventually, method 200 may stop when there are no further data to be stored in the storage system, and the storage system idles or shuts down.

Figure 3:
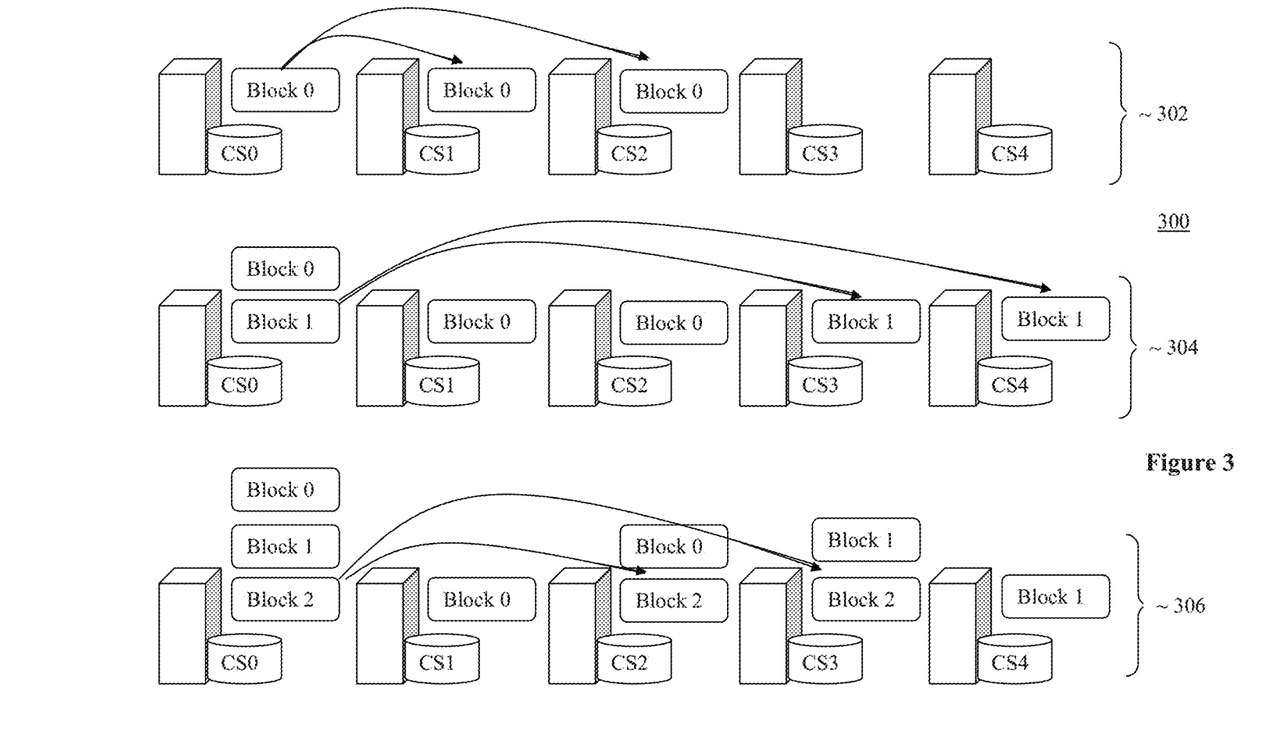
FIGS. 3-4 illustrate a method for generating erasure codes for data to be stored, in accordance with various embodiments.
Figure 4:
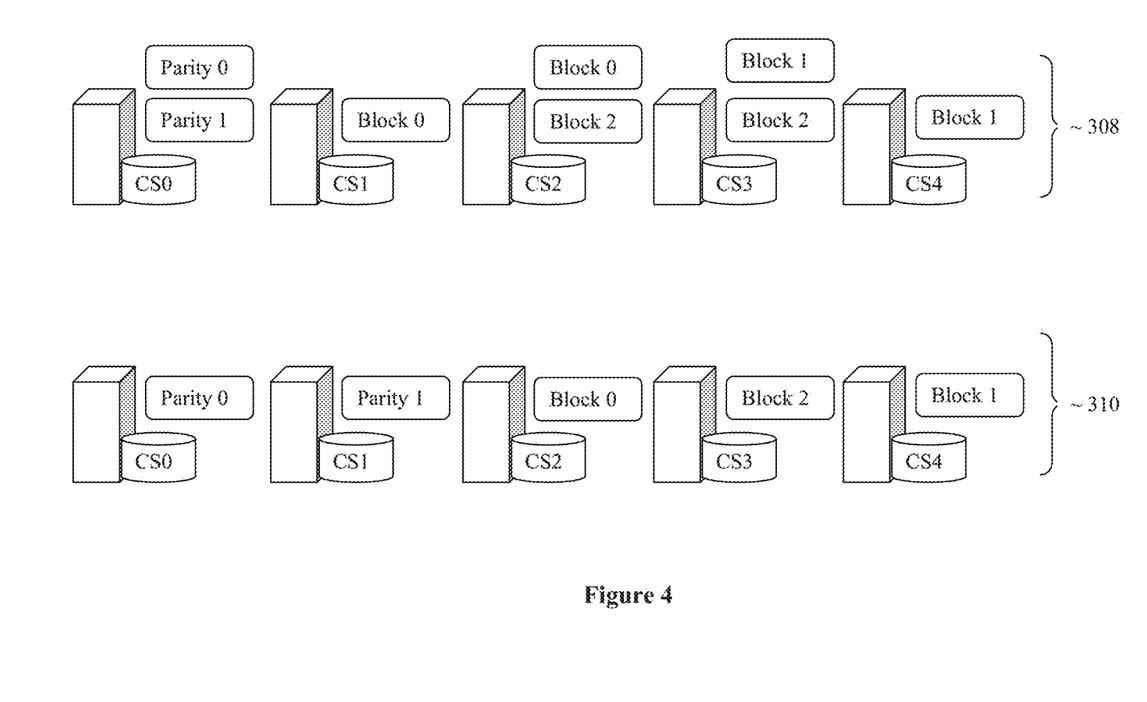

Referring now to FIGS. 3-4, wherein an example method for generating erasure codes for data to be stored is shown, in accordance with various embodiments. As shown, example method 300 for generating erasure codes may include operations performed in stages 302-310. The operations may be performed collectively, e.g., by the earlier described instances/threads of erasure code generation module 120. For ease of understanding, example method 300 will be described in a context, with k=3 and n=5, also referred to as a (3, 2) context. Further, example method 300 will be described with making 3 copies, before the (3, 2) erasure code is generated/calculated. However, example method 300 is not so limited, and may be practiced with different (k, n-k) pair, e.g., (5, 3), (10, 4), (10, 6) and so forth, and/or more or less copies before the (k, n-k) erasure codes are generated/calculated.

At stage 302, for the illustrated example, data block 0 may be stored into computer-storage (CS) node 0, and copied to two randomly selected nodes from CS1-CS4. For FIG. 3, it is assumed that CS1 and CS2 are randomly selected. At stage 304, for the illustrated example, data block 1 may be stored into CS0 (same as data block 0), and copied into previously unselected ones of CS1-CS4. For the illustration, the previously unselected ones are CS3 and CS4. At stage 306, for the illustrated example, data block 2 may be stored into CS0 (same as data blocks 1 and 2), and copied a new combination of two nodes. For the illustration, data block 2 is copied into nodes CS2 and CS3 (given the earlier copying were to nodes CS1-CS2, and CS3-CS4). In alternate embodiments, data block 2 may be copied to nodes CS1-CS3, CS1-CS4 or CS2-CS4 instead.

At stage 308, for the illustrated example, CS0 may generate parity 0 and parity 1 with two different functions for a double parity distributed storage scheme, such as RAID 6 (RAID=Redundant Array of Independent Disks). Thereafter, the replication may be reduced to 1. For example, at stage 310, parity 1 may be copied onto CS1, and thereafter data block 0 may be discarded from CS1. Further, thereafter, extra data blocks may be discarded from CS2-CS4. For the example illustration, data blocks 2 and 1 may be respectively discarded from nodes CS2 and CS3.

Thus, method 300 does not require network bandwidth to generate the parities. Further, the number of storage I/O operations is reduced, when compared to prior art approaches, such as the approach commonly referred to as the Carnegie Mellon University approach. Additionally, method 300 is not limited to double parity distributed storage approach like RAID 6, it may be scaled and practiced with other distributed storage approaches using more or less parities.

Figure 5:
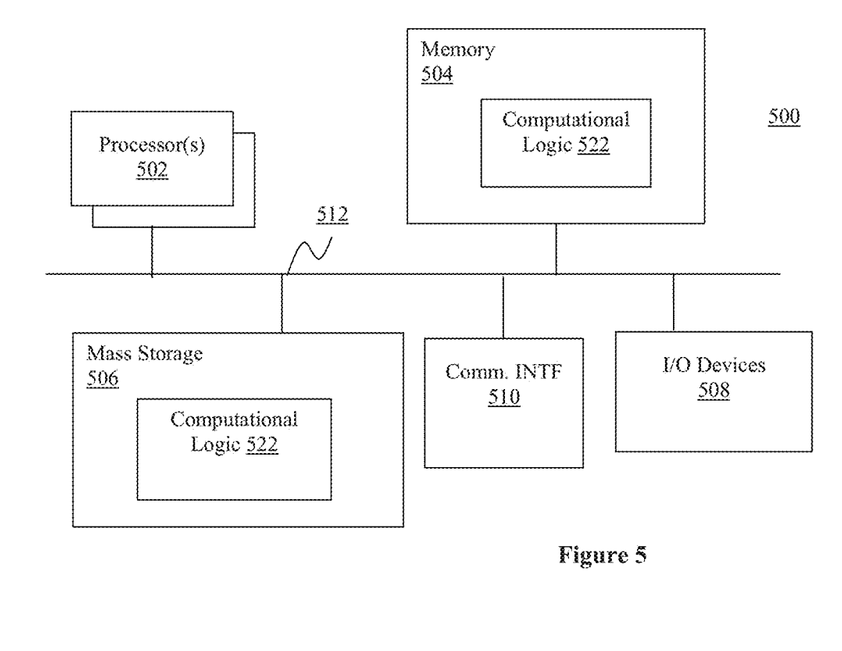
FIG. 5 illustrates an example computing system suitable for practicing the disclosure, in accordance with various embodiments.

Referring now to FIG. 5, wherein an example computer suitable for use for the arrangement of FIG. 1, in accordance with various embodiments, is illustrated. As shown, computer 500 may include one or more processors 502 and system memory 504. In embodiments, at least one of processors 502 includes multiple or processor cores on a die. Additionally, computer 500 may include mass storage devices 506 (such as diskette, hard drive, compact disc read only memory (CD-ROM) and so forth), input/output devices 508 (such as display, keyboard, cursor control and so forth) and communication interfaces 510 (such as network interface cards, modems and so forth). The elements may be coupled to each other via system bus 512, which may represent one or more buses. In the case of multiple buses, they may be bridged by one or more bus bridges (not shown).

Each of these elements may perform its conventional functions known in the art. In particular, mass storage devices 506 may be employed to store performance database 118, earlier described. Further, system memory 504 and mass storage devices 506 may be employed to store a working copy and a permanent copy of the programming instructions implementing the operations associated with dispatch engine 112, system load monitor 114, execution monitor 116, erasure code generation module 120 and/or benchmark engine 140, earlier described. The various elements may be implemented by assembler instructions supported by processor(s) 502 or high-level languages, such as, for example, C, that can be compiled into such instructions.

The permanent copy of the programming instructions may be placed into mass storage devices 506 in the factory, or in the field, through, for example, a distribution medium (not shown), such as a compact disc (CD), or through communication interface 510 (from a distribution server (not shown)). That is, one or more distribution media having an implementation of the agent program may be employed to distribute the agent and program various computing devices.

The number, capability and/or capacity of these elements 510-512 may vary, depending on the intended use of example computer 500, e.g., whether example computer 500 is a stationary computing device like a set-top box or a desktop computer, or a mobile computing device, like a smartphone, tablet, ultabook or laptop. The constitutions of these elements 510-512 are otherwise known, and accordingly will not be further described.

Figure 6:
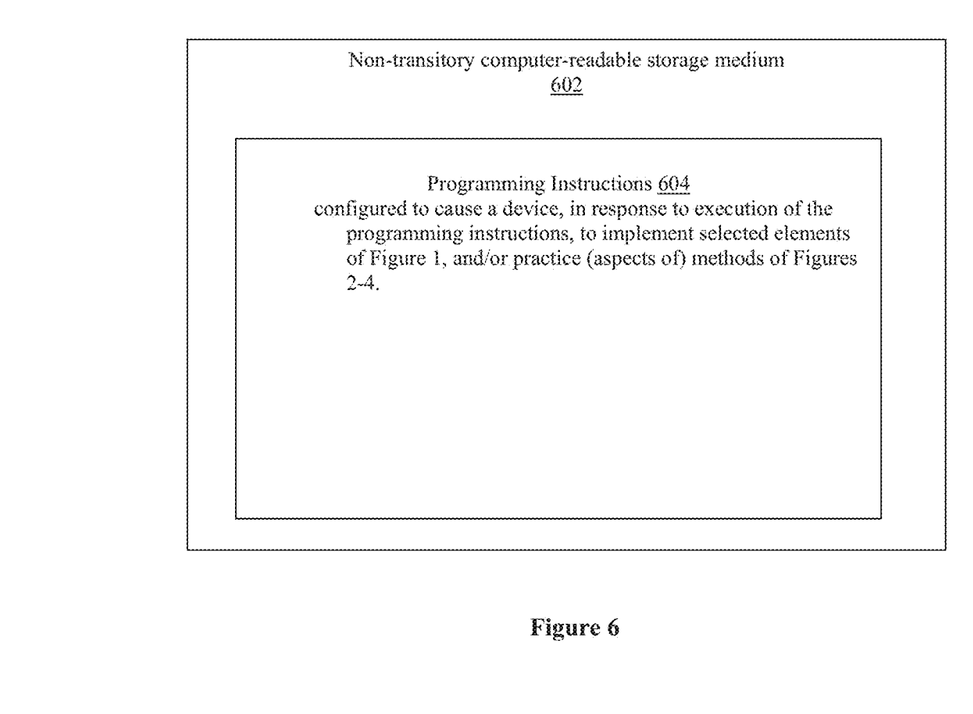
FIG. 6 illustrates an example storage medium with instructions configured to enable an apparatus to practice the present disclosure, in accordance with various embodiments.

FIG. 6 illustrates an example non-transitory computer-readable storage medium having instructions configured to practice all or selected ones of the operations associated with dispatch engine 112, system monitor 114, execution monitor 116, erasure code generation module 120 and/or benchmark engine 140; in accordance with various embodiments. As illustrated, non-transitory computer-readable storage medium 602 may include a number of programming instructions 604. Programming instructions 604 may be configured to enable a device, e.g., computer 400, in response to execution of the programming instructions, to perform, e.g., various operations of methods 200 and 300 of FIGS. 2-4, e.g., but not limited to, the operations performed in association with dispatch engine 112, system monitor 114, execution monitor 116, and/or erasure code generation module 120. In alternate embodiments, programming instructions 604 may be disposed on multiple non-transitory computer-readable storage media 602 instead.

Referring back to FIG. 5, for one embodiment, at least one of processors 502 may be packaged together with computational logic 522 (in lieu of storing in memory 504 and/or mass storage 506) configured to practice aspects of methods 200 and 300 of FIGS. 2-4. For one embodiment, at least one of processors 502 may be packaged together with computational logic 522 configured to practice aspects of the methods of FIGS. 2-4 to form a System in Package (SiP). For one embodiment, at least one of processors 502 may be integrated on the same die with computational logic 522 configured to practice aspects of methods 200 and 300 of FIGS. 2-4. For one embodiment, at least one of processors 502 may be packaged together with computational logic 522 configured to practice aspects of methods 200 and 300 of FIGS. 2-4 to form a System on Chip (SoC). For at least one embodiment, the SoC may be utilized in, e.g., but not limited to, a computer-storage node of a scale out storage system.

Thus, example embodiments described include, but are not limited to:

Example 1 which may be an apparatus for storing data. The apparatus may include a plurality of computer-storage nodes, an erasure code generation module, and a dispatch engine. Each computer-storage node may include at least one processor and at least one storage unit. The dispatch engine may launch one or more instances of the erasure code generation module to be operated by one or more processors of the computer-storage nodes to generate erasure codes for data to be stored in the storage units of the computer-storage nodes, wherein the number of instance of erasure code generation module launched is based at least in part on hardware configuration of the computer-storage nodes; and set operational parameters of the plurality of instances of the erasure code generation module, wherein the operational parameter is set based at least in part on current system load of the computer-storage nodes.

Example 2 may be example 1, wherein at least one of the processors comprises a plurality of processor cores.

Example 3 may be example 1 or 2, wherein the dispatch engine is to further retrieve the hardware configuration of the computer-storage nodes.

Example 4 may be any one of examples 1-3, wherein the dispatch engine is to set erasure code parameters of the erasure codes to be generated.

Example 5 may be any one of examples 1-4, wherein the dispatch unit is to further receive, information about the current system load.

Example 6 may be example 5, further comprising a system load monitor to monitor system load, and provide information about current system load to the dispatch engine.

Example 7 may be any one of examples 1-6, wherein the one or more instances of the erasure code module is to generate at least a first and a second parity of an erasure code from at least a first, a second and a third data block, and respectively store the first parity, the second parity, the first data block, the third data block, and the second data block in a first, a second, a third, a fourth, and a fifth of the computer-storage nodes.

Example 8 may be example 7, wherein the one or more instances of the erasure code module is to generate the first and second parities on the first computer-storage node by respective application of a first and a second function to the first, second and third data blocks, the first and second functions being different functions, and on generation of the second parity, transfer the second parity from the first computer-storage node to the second computer-storage node.

Example 9 may be example 8, wherein the one or more instances of the erasure code module is to further transfer the first, second and third data blocks to the first computer-storage node for generation of the first and second parities, and on generation of the first parity, delete the first, second and third data blocks from the first computer-storage node.

Example 10 may be example 8, wherein the one or more instances of the erasure code module is to further transfer the first data block to the second computer-storage node prior to receipt of the second parity at the second computer-storage node, and on receipt of the second parity from the second computer-storage node, delete the first data block from the second computer-storage node.

Example 11 may be example 8, wherein the one or more instances of the erasure code module is to transfer the first and third data blocks to the third computer-storage node prior to the generation and storage of the first and second parities at the first and second computer-storage nodes, and on generation and storage of the first and second parities, delete the third data block from the third computer-storage node.

Example 12 may be example 8, wherein the one or more instances of the erasure code module is to transfer the second and third data blocks to the fourth computer-storage node prior to the generation and storage of the first and second parities at the first and second computer-storage nodes, and on generation and storage of the first and second parities, delete the second data block from the fourth computer-storage node.

Example 13 may be example 8, wherein the one or more instances of the erasure code module is to transfer the second data block to the fifth computer-storage node prior to the generation and storage of the first and second parities at the first and second computer-storage nodes, and on generation and storage of the first and second parities, keep the second data block at the fifth computer-storage node.

Example 14 may be any one of claims 1-13 wherein the dispatch engine is to further modify the number of instances of the erasure code generation module launched, or their operational parameters, based at least in part on changes to the current system load.

Example 15 may be an apparatus for storing data. The apparatus may include a plurality of computer-storage nodes, and an erasure code generation module. The erasure code generation module may be operated by processors of the computer-storage nodes to generate erasure codes for data to be stored in the plurality of computer-storage nodes. One or more instance of the erasure code generation module are to copy a first data block to a first, a second, and a third of the computer-storage nodes; copy a second data block to the first, a fourth, and a fifth of the computer-storage nodes; copy a third data block to the first, the third, and the fourth computer-storage nodes; and generate a first and a second parity of the first, second, and third data block on the first computer-storage node.

Example 16 may be example 15, wherein the one or more instance of the erasure code generation module to generate the first and second parities by respectively applying a first and a second function to the first, second, and third data blocks, the first and second functions being different functions.

Example 17 may be example 15 or 16, wherein the one or more instance of the erasure code generation module to further transfer the second parity from the first computer-storage node to the second computer-storage node, and on transfer of the second parity to the second computer-storage node, discard the first data block from the second computer-storage node.

Example 18 may be any one of examples 15-17, wherein the one or more instance of the erasure code generation module to further, on transfer of the second parity to the second computer-storage node, discard the third data block from the third computer-storage node.

Example 19 may be any one of examples 15-18, wherein the one or more instance of the erasure code generation module to further, on transfer of the second parity to the second computer-storage node, discard the second data block from the fourth computer-storage node.

Example 20 may be a method for storing data. The method may include launching, by a storage system, a plurality of instances of an erasure code generation module, wherein the launching is based at least in part on hardware configuration of the storage system; setting, by the storage system, operational parameters of the plurality of instances of the erasure code generation module, wherein the setting is based at least in part on current system load of the storage system; and operating, by the storage system, the plurality of instances of the erasure code generation module to generate erasure codes for data to be stored in the storage system, in accordance with the operational parameters set.

Example 21 may be example 20, wherein the storage system is a scale out storage system having a plurality of computer-storage nodes, wherein at least one of the computer-storage nodes includes a microprocessor having a plurality of processor cores.

Example 22 may be example 20 or 21, wherein the method further comprises retrieving, by the dispatch engine, the hardware configuration of the storage system.

Example 23 may be any one of examples 20-22, wherein setting comprises setting erasure code parameters.

Example 24 may be any one of examples 20-23, wherein the method further comprises receiving, by the dispatch engine, information about the current system load.

Example 25 may be example 24, wherein receiving comprises receiving the information about the current system load, by the dispatch engine, from a system load monitor of the storage system, wherein the method further comprises monitoring current system load, by the system load monitor.

Example 26 may be any one of examples 20-25, wherein the storage system comprises a scale out storage system having a plurality of computer-storage nodes; wherein operating comprises operating, by the storage system, the plurality of instances of the erasure code generation module to generate at least a first and a second parity of an erasure code from at least a first, a second and a third data block, and respectively store the first parity, the second parity, the first data block, the third data block, and the second data block in a first, a second, a third, a fourth, and a fifth of the computer-storage nodes.

Example 27 may be example 26, wherein generate comprises generate the first and second parities on the first computer-storage node by respective application of a first and a second function to the first, second and third data blocks, the first and second functions being different functions, and wherein respectively store comprises on generation of the second parity, transfer the second parity from the first computer-storage node to the second computer-storage node.

Example 28 may be example 27, wherein generate further comprises transfer of the first, second and third data blocks to the first computer-storage node for the generation of the first and second parities, and wherein store comprises on generation of the first parity, delete the first, second and third data blocks from the first computer-storage node.

Example 29 may be example 27, wherein generate further comprises transfer of the first data block to the second computer-storage node prior to receiving the second parity at the second computer-storage node, and store comprises on receipt of the second parity from the second computer-storage node, delete the first data block from the second computer-storage node.

Example 30 may be example 27, wherein store further comprises transfer of the first and third data blocks to the third computer-storage node prior to the generation and storage of the first and second parities at the first and second computer-storage nodes, and on generation and storage of the first and second parities, delete the third data block from the third computer-storage node.

Example 31 may be example 27, wherein tore further comprises transfer of the second and third data blocks to the fourth computer-storage node prior to the generation and storage of the first and second parities at the first and second computer-storage nodes, and on generation and storage of the first and second parities, delete the second data block from the fourth computer-storage node.

Example 32 may be example 27, wherein store further comprises transfer of the second data block to the fifth computer-storage node prior to the generation and storage of the first and second parities at the first and second computer-storage nodes, and on generation and storage of the first and second parities, keeping the second data block at the fifth computer-storage node.

Example 33 may be example 27, further comprising monitoring, by the storage system, the operating; and modifying the number of instances of the erasure code generation module or their operational parameters, based at least in part on a result of the monitoring.

Example 34 may be a method for storing data. The method may include copying a first data block, by a storage system, to a first, a second, and a third computer-storage node of the storage system; copying a second data block, by the storage system, to a first, a fourth, and a fifth computer-storage node of the storage system; copying a third data block, by the storage system, to a first, a third, and a fourth computer-storage node of the storage system; and generating, by the storage system, a first and a second parity of the first, the second, and the third data block on the first computer-storage node.

Example 35 may be example 34, wherein generating comprises generating the first and second parities by respectively applying a first and a second function to the first, second, and third data blocks, the first and second functions being different functions.

Example 36 may be example 34 or 35, further comprising transferring the second parity from the first computer-storage node to the second computer-storage node, and on transfer of the second parity to the second computer-storage node, discarding the first data block from the second computer-storage node.

Example 37 may be any one of examples 34-36, further comprising on transfer of the second parity to the second computer-storage node, discarding the third data block from the third computer-storage node.

Example 38 may be any one of examples 34-37, further comprising on transfer of the second parity to the second computer-storage node, discarding the second data block from the fourth computer-storage node.

Example 39 may be an apparatus for storing data. The apparatus may include a plurality of computer-storage nodes, wherein each computer-storage node includes at least one processor and at least one storage unit. The apparatus may further include an erasure code generation module; and, means for dispatching a plurality of instances of the erasure code generation module for operation by the processors to generate erasure codes for data to be stored in the storage units, wherein the number of instances dispatched is based at least in part on hardware configuration of the plurality of computer-storage nodes, wherein the dispatch engine is to further set operational parameters of the instances of the erasure code generation module, based at least in part on current system load of the plurality of computer-storage nodes.

Example 40 may be example 39, further comprising means for monitoring current system load, and for providing information about the current system load to the means for dispatching.

Example 41 may be example 39 or 40, further comprising means for monitoring execution of the instances of the erasure code generation module, for providing feedback to the means for dispatching, wherein the means for dispatching further adapts the number of instances of the erasure code generation module, and their operational parameters, based at least in part on the feedback.

Example 42 may be any one of examples 39-41, wherein the erasure code generation module is to generate at least a first and a second parity of an erasure code from at least a first, a second and a third data block, and respectively store the first parity, the second parity, the first data block, the third data block, and the second data block in a first, a second, a third, a fourth, and a fifth of the computer-storage nodes.

Example 43 may be at least one computer-readable storage medium comprising a plurality of instructions configured to cause a storage system, in response to execution of the instructions by the storage medium, to perform any one of the methods of examples 20-33.

Example 44 may be at least one storage medium comprising a plurality of instructions configured to cause a storage system, in response to execution of the instructions by the storage medium, to perform any one of the methods of examples 34-38.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. An apparatus for storing data, comprising:
a plurality of computer-storage nodes, wherein each computer-storage node includes at least one processor and at least one storage unit;
an erasure code generation module to generate erasure codes for data to be stored across a plurality of the storage units of the computer-storage nodes; and
a dispatch engine to:
launch one or more execution threads of the erasure code generation module to be operated in parallel by one or more processors of the computer-storage nodes to generate the erasure codes for data to be stored across a plurality of the storage units of the computer-storage nodes, wherein the number of execution threads of the erasure code generation module launched is based at least in part on hardware configuration of the computer-storage nodes; and
set one or more erasure code parameters for the plurality of execution threads of the erasure code generation module, wherein the one or more erasure code parameters are set based at least in part on current system workload of the computer-storage nodes.

2. The apparatus of claim 1, wherein at least one of the processors comprises a plurality of processor cores.

3. The apparatus of claim 1 wherein the dispatch engine is to further retrieve the hardware configuration of the computer-storage nodes.

4. The apparatus of claim 1, wherein the dispatch engine is to further receive, information about the current system workload.

5. The apparatus of claim 4, further comprising a system workload monitor to monitor system workload, and provide information about current system workload to the dispatch engine.

6. The apparatus of claim 1, wherein the one or more execution threads of the erasure code module are to cooperate and generate in parallel at least a first and a second parity of an erasure code from at least a first, a second and a third data block, and respectively store the first parity and the second parity at a first and a second storage units of a first and a second of the computer-storage nodes, with the first data block, the third data block, and the second data block respectively stored in a third, a fourth, and a fifth storage unit of a third, a fourth and a fifth of the computer-storage nodes.

7. One or more non-transitory computer-readable storage medium having a plurality of instructions, in response to execution of the instructions by a storage system, to cause a storage system to:
launch a plurality of execution threads of an erasure code generation module to be executed in parallel to generate erasure codes for data to be stored across a plurality of the storage units of the computer-storage nodes, wherein the launching is based at least in part on hardware configuration of the storage system;
set one or more erasure code parameters for the plurality of execution threads of the erasure code generation module, wherein the setting is based at least in part on current system workload of the storage system; and
operate, the plurality of execution threads of the erasure code generation module to generate the erasure codes for data to be stored across the storage system, in accordance with the erasure code parameters set.

8. The storage medium of claim 7, wherein the storage system is a scale out storage system having a plurality of computer-storage nodes, wherein at least one of the computer-storage nodes includes a microprocessor having a plurality of processor cores.

9. The storage medium of claim 7, wherein launch comprises launch, using a dispatch engine of the storage system, the plurality of execution threads of the erasure code generation module, based at least in part on hardware configuration of the storage system, and wherein the storage system to further retrieve, using the dispatch engine, the hardware configuration of the storage system.

10. The storage medium of claim 7, wherein set erasure code parameters comprises set one or more buffer sizes, erasure code sizes, number of k symbols to be encoded into n symbols.

11. The storage medium of claim 7, wherein set comprises set, using a dispatch engine of the storage system, the erasure code parameters of the plurality of execution threads of the erasure code generation module, based at least in part on current system workload of the storage system; and wherein the storage system to further comprises receive, using the dispatch engine, information about the current system workload.

12. The storage medium of claim 11, wherein receive comprises receive the information about the current system workload, using the dispatch engine, from a system workload monitor of the storage system, wherein the storage system to further monitor current system workload, using the system workload monitor.

13. The storage medium of claim 7, wherein the storage system comprises a scale out storage system having a plurality of computer-storage nodes; wherein operate comprises operate the plurality of execution threads of the erasure code generation module to generate at least a first and a second parity of an erasure code from at least a first, a second and a third data block, and respectively store the first parity, the second parity, the first data block, the third data block, and the second data block in a first, a second, a third, a fourth, and a fifth of the computer-storage nodes.

* * * * *

UNITED STATES PATENT AND TRADEMARK OFFICE
CERTIFICATE OF CORRECTION

PATENT NO. : 9,292,384 B2
APPLICATION NO. : 14/125297
DATED : March 22, 2016
INVENTOR(S) : Jin et al.

Page 1 of 1

It is certified that error appears in the above-identified patent and that said Letters Patent is hereby corrected as shown below:

In the claims

Claim 4, column 11
Line 33 reads "receive," and should read --receive--.

Claim 7, column 12
Line 29 reads "operate," and should read --operate--.

Claim 9, column 12
Line 42 reads "system to" and should read --system is to--.

Claim 11, column 12
Line 54 reads "system to further" and should read --system further--.

Claim 12, column 12
Line 60 reads "system to" and should read --system is to--.

Signed and Sealed this
Fifth Day of July, 2016

Michelle K. Lee
*Director of the United States Patent and Trademark Office*